US012805099B2

(12) United States Patent
Kwak

(10) Patent No.: US 12,805,099 B2
(45) Date of Patent: Nov. 17, 2026

(54) LIGHT EMITTING DISPLAY DEVICE

(71) Applicant: LG Display Co., Ltd., Seoul (KR)

(72) Inventor: Changhwan Kwak, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/381,646

(22) Filed: Nov. 6, 2025

(65) Prior Publication Data

US 2026/0190563 A1 Jul. 2, 2026

(30) Foreign Application Priority Data

Dec. 30, 2024 (KR) ........................ 10-2024-0201424

(51) Int. Cl.

| | |
|---|---|
| ***H10H 29/32*** | (2025.01) |
| ***H10H 29/39*** | (2025.01) |
| ***H10H 29/49*** | (2025.01) |
| ***H10H 29/85*** | (2025.01) |
| ***H10H 29/855*** | (2025.01) |

(52) U.S. Cl.

CPC ............ *H10H 29/32* (2025.01); *H10H 29/39* (2025.01); *H10H 29/49* (2025.01); *H10H 29/8517* (2025.01); *H10H 29/8552* (2025.01)

(58) Field of Classification Search

CPC ........ H10H 29/32; H10H 29/49; H10H 29/39; H10H 29/8517; H10H 29/8552

See application file for complete search history.

(56) References Cited

U.S. PATENT DOCUMENTS

2009/0225013 A1 9/2009 Lee et al.
2010/0201656 A1* 8/2010 Han .................... G09G 3/3233 345/205

FOREIGN PATENT DOCUMENTS

KR 10-0911981 B1 8/2009
KR 10-2010-0091701 A 8/2010
KR 10-2020-0009671 A 1/2020

* cited by examiner

*Primary Examiner* — Yaron Cohen
(74) *Attorney, Agent, or Firm* — Fenwick & West LLP

(57) ABSTRACT

A light emitting display device according to embodiments of the present disclosure includes: a substrate, a pixel, a light emitting diode, a compensation light emitting diode, and an emission layer. The pixel is disposed on the substrate. The pixel includes an emission area a non-emission area. The light emitting diode is disposed at the emission area. The compensation light emitting diode is disposed at the non-emission area. The emission layer is extended from the light emitting diode to the compensation light emitting diode.

18 Claims, 9 Drawing Sheets

LIGHT EMITTING DISPLAY DEVICE

CROSS-REFERENCE TO RELATED APPLICATION

The present application claims priority to Republic of Korea Patent Application No. 10-2024-0201424 filed on Dec. 30, 2024, which is hereby incorporated by reference in its entirety.

BACKGROUND

Field

The present disclosure relates to a light emitting display device.

Discussion of Related Art

A light emitting display device, which is a self-luminous display device, may have a structure in which a plurality of pixel areas equipped with light emitting diodes are arranged. As the pixel density increases, the distance between pixels becomes closer. Additionally, with the same resolution, the distance between the light emitting areas becomes closer as the light emitting area increases to improve brightness (or luminance). Under this condiction, when a common functional layer is deposited as a single layer across all pixels, a lateral leakage current may occur between neighboring pixels in the horizontal direction.

When lateral leakage current occurs, unintended pixels may operate, making it difficult to display normal colors, which may result in a problem of deterioration in image quality. Various methods have been proposed to prevent lateral leakage current.

However, in the related arts for preventing lateral leakage current, a problem may occur in voltage compensation at a specific color pixel. The luminance expressed on the display device may be represented by dividing it into 256 gray levels between perfect black and perfect white. For example of 8-bit grayscale, the perfect black (or true black) may have a grayscale value of 255, and the perfect white (or true white) may have a grayscale value of 0. For example of 16-bit grayscale, the perfect black may have a grayscale value of 65536, and the perfect white may have a grayscale value of 0.

In a situation where a specific pixel is displayed the perfect black and then it is changed to a gray scale-color, or a specific pixel is displayed a gray scale-color and then it is changed to the perfect white, the color expression may not be performed to display correct grayscale value. Therefore, rather than simply eliminating the lateral leakage current, a more efficient way to control the lateral leakage current is needed. For example, it is necessary to develop a structure for an ultra-high resolution light emitting display device that may eliminate the lateral leakage current, or may intentionally provide compensation current depending on the driving conditions of the display device.

SUMMARY

The purpose of the present disclosure, as for solving the problems described above, is to provide a top emission type light emitting display device or a top emission type transparent light emitting display device having a structure capable of compensating driving current so as to implement the best image quality in any condition according to the grayscale level of an image displayed on a display device. Another purpose of the present disclosure is to provide a top emission type light emitting display device or a top emission type transparent light emitting display device that may provide the best image quality by eliminating the lateral leakage current or supplying compensating current according to the grayscale level of an image displayed on the display device.

In order to accomplish the above-mentioned purposes of the present disclosure, a light emitting display device according to one or more embodiments of the present disclosure comprises: a substrate, a pixel, a light emitting diode, a compensation light emitting diode, and an emission layer. The pixel is disposed on the substrate. The pixel includes an emission area a non-emission area. The light emitting diode is disposed at the emission area. The compensation light emitting diode is disposed at the non-emission area. The emission layer is extended from the light emitting diode to the compensation light emitting diode.

In one or more embodiments, the light emitting display device further comprises: a color filter disposed at the emission area; and a black matrix disposed at the non-emission area.

In one or more embodiments, the light emitting diode is disposed as corresponding to the color filter. The compensation light emitting diode is disposed as corresponding to the black matrix.

In one or more embodiments, the light emitting display device further comprising: a driving thin film transistor connected to the light emitting diode; a switching thin film transistor connected to the driving thin film transistor; and a compensation thin film transistor connected to the compensation light emitting diode.

In one or more embodiments, the light emitting display device further comprising: a scan line and a data line connected to the switching thin film transistor; a driving voltage line connected to the driving thin film transistor; and a compensation scan line and a compensation current line connected to the compensation thin film transistor.

In one or more embodiments, the light emitting diode includes: an anode electrode; an emission layer on the anode electrode; and a cathode electrode on the emission layer. The compensation light emitting diode includes: a compensation anode electrode; the emission layer on the compensation anode electrode; and the cathode electrode on the emission layer.

In one or more embodiments, the compensation light emitting diode is disposed along at least one side of the light emitting diode.

In one or more embodiments, the compensation light emitting diode has a close curve shape fully surrounding the light emitting diode.

In one or more embodiments, the compensation light emitting diode has an open curve shape partially surrounding the light emitting diode.

In one or more embodiments, the light emitting diode includes a first light emitting diode and a second light emitting diode arranged on the substrate. The compensation light emitting diode is disposed between the first light emitting diode and the second light emitting diode.

In one or more embodiments, the compensation light emitting diode has a close curve shape fully surrounding the first light emitting diode.

In one or more embodiments, the compensation light emitting diode has an open curve shape partially surrounding the first light emitting diode.

In one or more embodiments, the light emitting display device further includes: a third light emitting diode disposed adjacent to the first light emitting diode and the second light emitting diode on the substrate. The compensation light emitting diode is disposed at least one of between the first light emitting diode and the second light emitting diode, between the second light emitting diode and the third light emitting diode, and between the first light emitting diode and the third light emitting diode.

In one or more embodiments, the compensation light emitting diode has a close curve shape surrounding the first light emitting diode, the second light emitting diode and the third light emitting diode.

In one or more embodiments, the compensation light emitting diode has a shape separating the first light emitting diode, the second light emitting diode and the third light emitting diode from each other.

The light emitting display device according to one or more embodiments of the present disclosure may have a compensation thin film transistor that may block the lateral leakage current or may supply compensation current depending on the gradation status of an image displayed on the display device. Therefore, by discharging the lateral leakage current to the outside, or by providing compensation current to the light emitting diode, the light emitting display device may provide high quality image information.

The light emitting display device according to one or more embodiments of the present disclosure may include a compensation light emitting diode capable of emitting the lateral leakage current or providing compensation current. The compensation light emitting diode may be arranged adjacent to the light emitting diode providing the image information, so as to discharge the lateral leakage current to the outside or to provide the compensation current to the light emitting diode. Therefore, the light emitting display device according to the present disclosure may provide the best quality of image information. As the compensation light emitting diode may be placed in a non-emission area being covered by the black matrix, the light emitting state is not exposed to the outside, so the image information may not be distorted due to the light emitting state of the compensation light emitting diode.

In addition to the effects of the present disclosure mentioned above, other features and advantages of the present disclosure are described below, or may be clearly understood by those skilled in the art from such descriptions and explanations.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
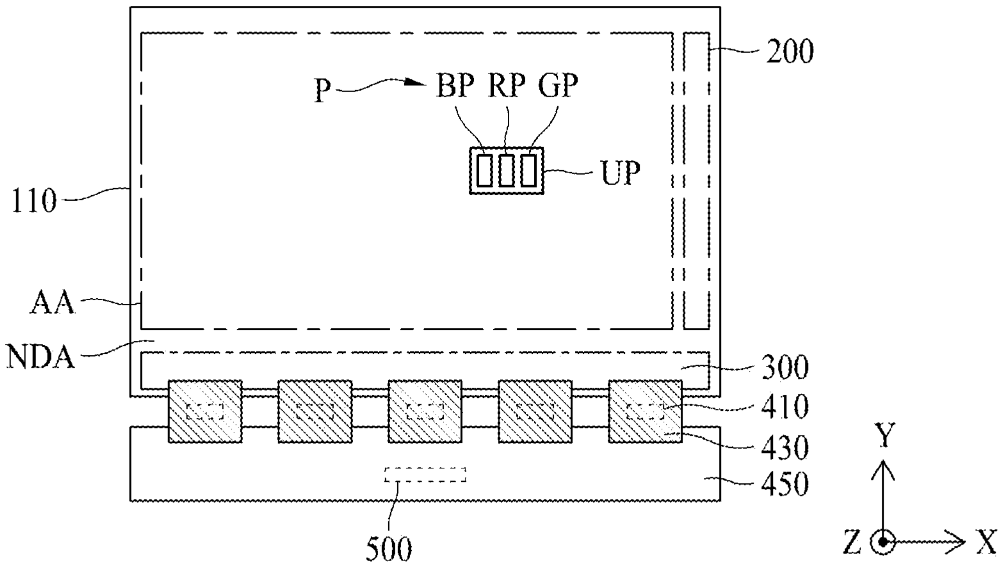
FIG. 1 is a plan view illustrating a schematic structure of a light emitting display device according to one or more embodiments of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various embodiments of the present disclosure, are merely given by way of example. Therefore, the present disclosure is not limited to the illustrated details. Like reference numerals refer to like elements throughout the disclosure unless otherwise specified. In the following description, where the detailed description of the relevant known function or configuration may unnecessarily obscure an important point of the present disclosure, a detailed description of such known function of configuration may be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the present disclosure, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the present disclosure should be understood as follows.

In the present disclosure, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure. The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to one or more embodiments of the present disclosure will be described in detail with reference to the attached drawings. Wherever possible, the same reference numbers will be used throughout the drawings to refer to the same or like parts.

Hereinafter, referring to the attached figures, the present disclosure will be explained. Since a scale of each of elements shown in the accompanying drawings may be different from an actual scale for convenience of description, the present disclosure is not limited to the scale shown in the drawings.

FIG. 1 is a plan view illustrating a schematic structure of a light emitting display device according to one or more embodiments of the present disclosure. In FIG. 1, X-axis refers to the direction parallel to the scan line, Y-axis refers to the direction parallel to the data line, and Z-axis refers to the height direction of the display device.

Referring to FIG. 1, the electroluminescence display comprises a substrate 110, a gate (or scan) driver 200, a pad portion 300, a source driving IC (Integrated Circuit) 410, a flexible circuit film 430, a circuit board 450, and a timing controller 500. A plurality of pixels P may be arrayed on the substrate 110. For example, a red pixel RP, a green pixel GP and a blue pixel BP may be sequentially arrayed in a horizontal (X-axis) direction. One group of a red pixel RP, a green pixel GP and a blue pixel BP may configure a unit pixel UP. For another example, even though it is not shown in figure, a red pixel, a green pixel, a white pixel and a blue pixel may be sequentially arrayed in a horizontal direction. One group of a red pixel, a green pixel, a white pixel and a blue pixel may configure a unit pixel.

The substrate 110 may include an electrical insulating material or a flexible material. The substrate 110 may be made of a glass, a metal or a plastic, but it is not limited thereto. When the light emitting display device is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the video images, may be defined as the majority middle area of the substrate 110, but it is not limited thereto. In the display area AA, a plurality of pixels P are arrayed in a matrix manner. Further, a plurality of scan lines (or gate lines), a plurality of data lines may be disposed as crossing each other. Each of pixels P may be disposed at the crossing area of the scan line running to X-axis and the data line running to Y-axis.

Here, a pixel P may represent any one of color among red, green and blue or red, green, blue or white. A red pixel RP, a green pixel GP and a blue pixel BP may be gathered to form one unit pixel UP. Even though it is not shown in figures, a red pixel, a green pixel, a blue pixel and a white pixel may be gathered to form one unit pixel UP. For example, each of the pixels representing each color may be called a 'sub-pixel', and it may be explained that these 'sub-pixels' form one 'pixel'. As another example, it may be explained that pixels representing each color are called 'pixel P; BP, RP and GP', and three of these 'pixels BP, RP and GP' are gathered to form one 'pixel UP'. Hereinafter, the latter case will be described.

The non-display area NDA, which is an area not representing the video images, may be defined at the circumference areas of the substrate 110 surrounding all or some of the display area AA. In the non-display area NDA, the gate driver 200 and the pad portion 300 may be formed or disposed.

The gate driver 200 may supply the scan (or gate) signals to the scan lines SL according to the gate control signal received from the timing controller 500 through the pad portion 300. The gate driver 200 may be formed at the non-display area NDA at any one outside of the display area DA on the substrate 110, as a GIP (Gate driver In Panel) type. GIP type means that the gate driver 200 is directly formed on the substrate 110. For example, the gate driver 200 may be configured with shift registers. In the GIP type, the transistors for shift registers of the gate driver 200 are directly formed on the upper surface of the substrate 110.

The pad portion 300 may be disposed in the non-display area NDA at one side edge of the display area AA of the substrate 110. The pad portion 300 may include data pads connected to each of the data lines DL, driving current pads connected to the driving current lines, a high voltage pad receiving a high voltage, and a low voltage pad receiving a low voltage.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible circuit film 430 as a COF (Chip On Film) or COP (Chip On Plastic) type.

The flexible circuit film 430 may include a plurality of first link lines connecting the pad portion 300 to the source driving IC 410, and a plurality of second link lines connecting the pad portion 300 to the circuit board 450. The flexible circuit film 430 may be attached on the pad portion 300 using an anisotropic conducting film, so that the pad portion 300 may be connected to the first link lines of the flexible circuit film 430.

The circuit board 450 may be attached to the flexible circuit film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the operation timing of the source driving IC 410, based on the timing signal. The timing controller 500 may supply the gate control signal to the gate driver 200 and supply the source control signal to the source driving IC 410. Depending on the product types, the timing controller 500 may be integrated with the source driving IC 410 into one driving chip and may be mounted on the substrate 110 to be connected to the pad portion 300.

Figure 2:
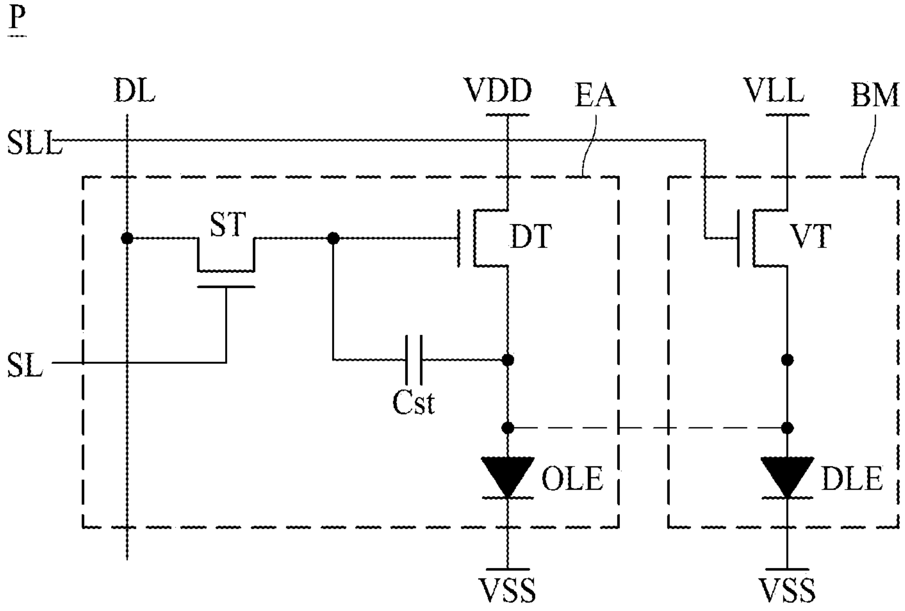
FIG. 2 is a circuit diagram illustrating a structure of a pixel disposed in a light emitting display device according to one or more embodiments of the present disclosure.

Hereinafter, referring to FIG. 2, a detailed structure of a light emitting display device according to one or more embodiments of the present disclosure will be explained. FIG. 2 is a circuit diagram illustrating a structure of a pixel disposed in a light emitting display device according to one or more embodiments of the present disclosure.

Referring to FIG. 2, one pixel P of the light emitting display device according to one or more embodiments of the present disclosure may include an emission area EA and a black matrix BM. The emission area EA may be the area that provides light and displays image information. The black matrix BM may be an area surrounding the emission area EA for dividing each emission area EA, and may not display image information.

Each pixel P of the light emitting display according to the present disclosure may be defined by a scan line SL, a data line DL, a compensation scan line SLL and a driving current line VDD. Each pixel P of the light emitting display may include a switching thin film transistor ST, a driving thin film transistor DT, a light emitting diode OLE, a storage capacitance (or capacitor) Cst, a compensation thin film transistor VT and a compensation light emitting diode DLE. The driving current line VDD may be supplied with a high-level voltage for driving the light emitting diode OLE. The compensation current line VLL may be supplied with a compensation voltage variable for driving the compensation light emitting diode DLE.

The driving thin film transistor DT may be disposed between the driving current line VDD and the light emitting diode OLE. The driving thin film transistor DT may control the amount of current flowing from the driving current line VDD to the light emitting diode OLE according to the voltage difference between the gate electrode and the source electrode. The light emitting diode OLE may display an image by emitting light according to the current controlled by a driving thin film transistor DT.

The compensation thin film transistor VT may be disposed between the compensation current line VLL and the compensation light emitting diode DLE. The compensation thin film transistor VT may control the amount of current flowing from the compensation current line VLL to the compensation light emitting diode DLE according to the voltage difference between the gate electrode and the source electrode. The compensation light emitting diode DLE may generate light or not according to the current controlled by a driving thin film transistor DT. Even when the compensation light emitting diode DLE generates light, the light may be blocked by the black matrix BM, so the light may not be emitted to the outside.

The light emitting diode OLE and the compensation light emitting diode DLE arranged in the pixel P may have the same structure. For example, the anode electrodes may be separated from each other. However, the emission layer may be continuously deposited from the light emitting diode OLE to the compensation light emitting diode DLE. This structure is shown in FIG. 2 as a horizontal dotted line. When the light emitting diode OLE of the pixel P is driven, the lateral leakage current may be transmitted along this emission layer EL to the compensation light emitting diode DLE. Alternatively, the compensation current may be supplied from the compensation light emitting diode DLE to the light emitting diode OLE.

The compensation light emitting diode DLE may be driven by the compensation thin film transistor VT. In addition, the compensation thin film transistor VT may be driven by a compensation scan line SLL and a compensation current line VLL. Therefore, the compensation light emitting diode DLE may be driven independently of the light emitting diode OLE. Depending on the operating status of the light emitting diode OLE, the operating status of the compensation light emitting diode DLE may be changed. For an example, the lateral leakage current generated from a light emitting diode OLE may be removed by a compensation light emitting diode DLE. For another example, a lateral leakage current may be generated from a compensation light emitting diode DLE, as a compensation current, to compensate the current for operating the light emitting diode OLE.

First Embodiment

Figure 3:
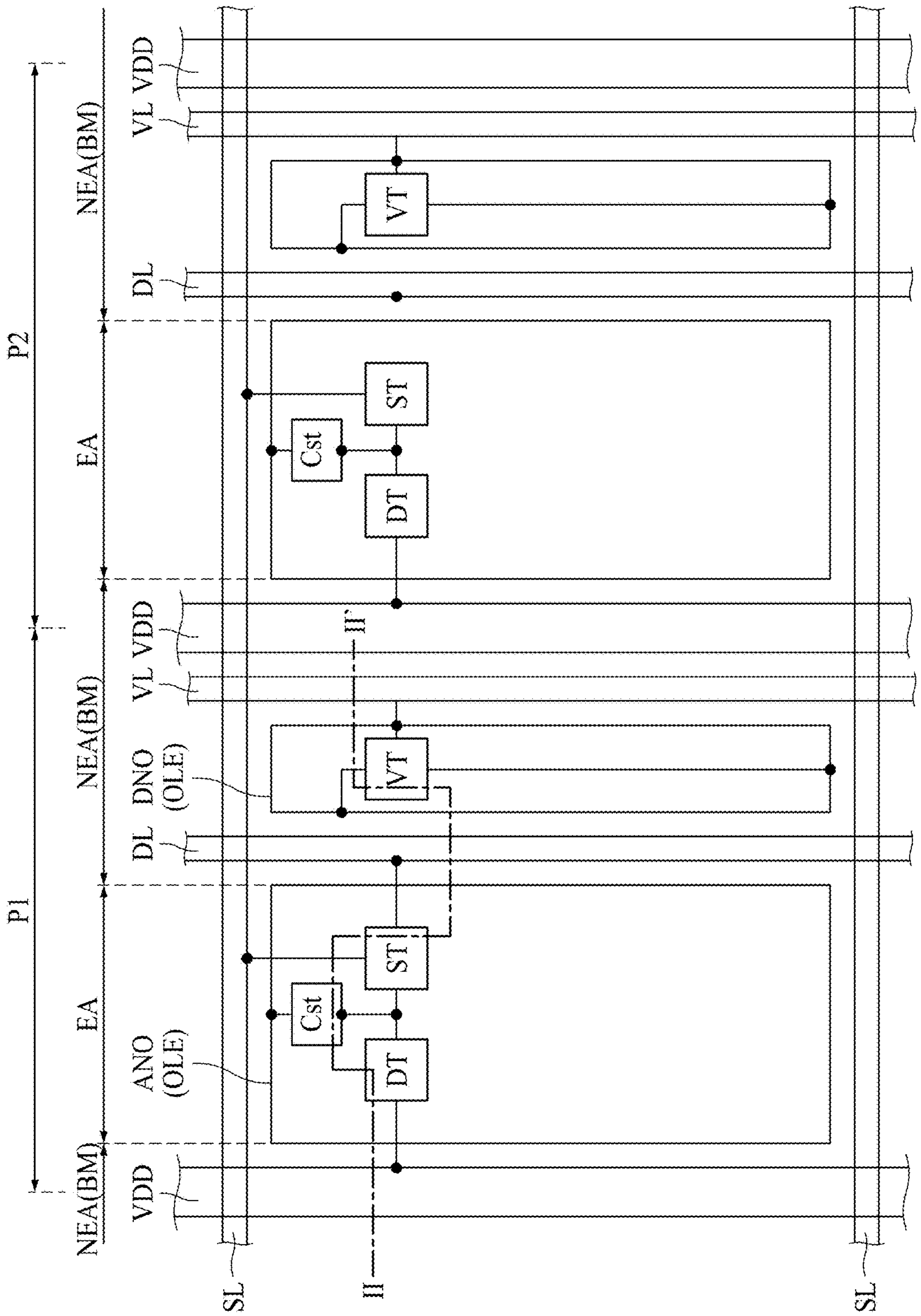
FIG. 3 is an enlarged plan view illustrating a structure of two pixels sequentially disposed in a light emitting display device according to one or more embodiments of the present disclosure.
Figure 4:
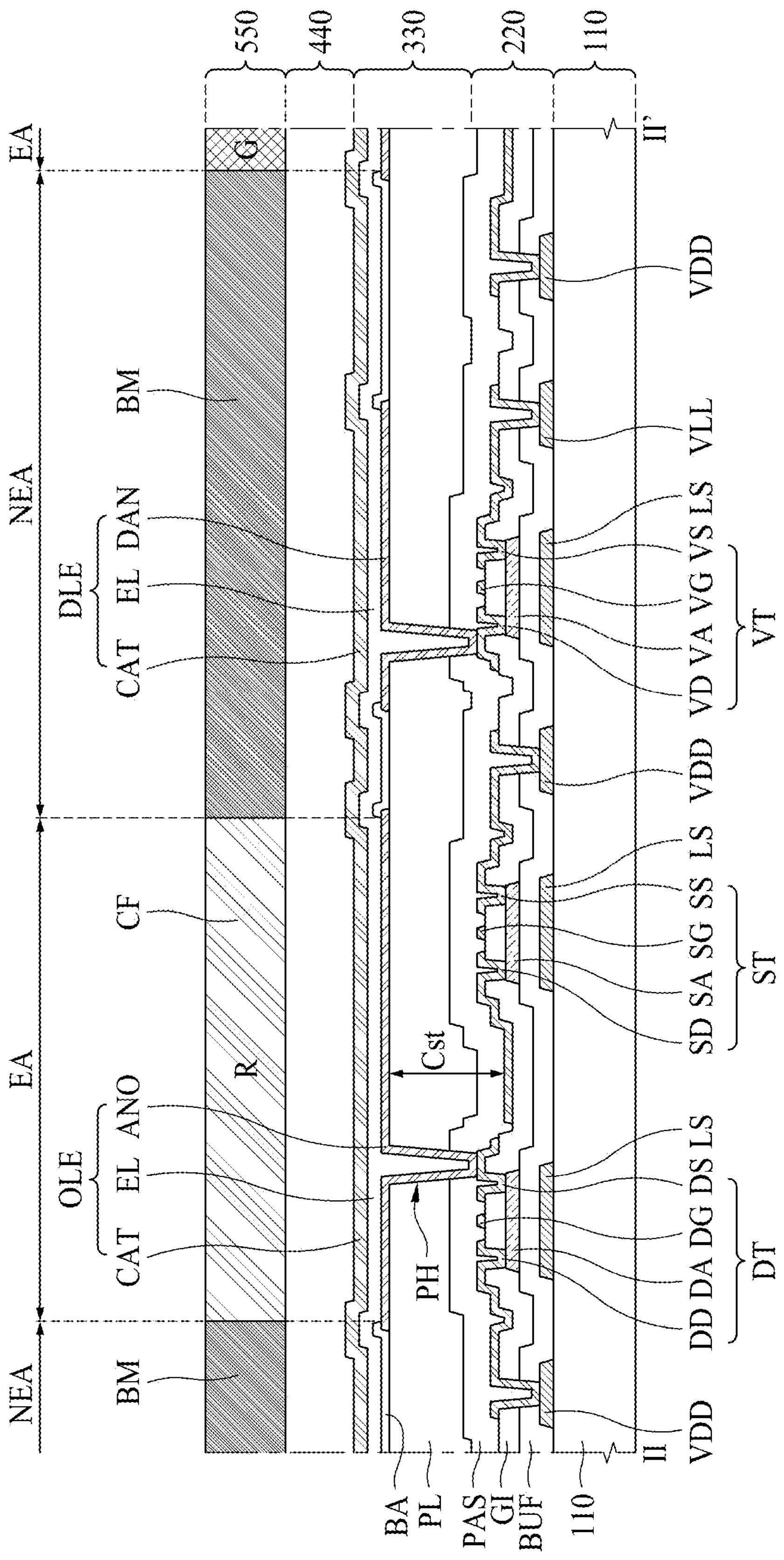
FIG. 4 is a cross-sectional view, cutting along line II-II' in FIG. 3, for illustrating a structure of one pixel in a light emitting display device according to one or more embodiments of the present disclosure.

Hereinafter, referring to FIGS. 3 and 4, a detailed structure of a light emitting display device according to one or more embodiments of the present disclosure will be explained. FIG. 3 is an enlarged plan view illustrating a structure of two pixels sequentially disposed in a light emitting display device according to one or more embodiments of the present disclosure. FIG. 4 is a cross-sectional view, cutting along line II-II' in FIG. 3, for illustrating a structure of one pixel in a light emitting display device according to one or more embodiments of the present disclosure.

Referring to FIGS. 3 and 4, two pixels, i.e., a first pixel P1 and a second pixel P2, may be arranged adjacent to each other, and a black matrix BM disposed there-between. Each of the first pixel P1 and the second pixel P2 may be defined by the scan line SL, a data line DL and a driving current line VDD. Each of the first pixel P1 and the second pixel P2 may include a switching thin film transistor ST, a driving thin film transistor DT, a capacitance Cst and a light emitting diode OLE.

A switching thin film transistor ST and a driving thin film transistor DT may be formed on a substrate 110. For example, the switching thin film transistor ST may be configured to be connected to the scan line SL and the data line DL is crossing. The switching thin film transistor ST may include a gate electrode SG, a semiconductor layer SA, a source electrode SS and a drain electrode SD. The gate electrode SG of the switching thin film transistor ST may be a portion of the scan line SL. The semiconductor layer SA may be disposed as crossing the gate electrode SG. The overlapped portion of the semiconductor layer SA with the gate electrode SG may be defined as the channel area. The source electrode SS may be branched from or connected to the data line DL, and the drain electrode SD may be connected to the driving thin film transistor DT. The source electrode SS may be one side of the semiconductor layer SA from the channel area, and the drain electrode SD may be the other side of the semiconductor layer SA. By supplying the data signal to the driving thin film transistor DT, the switching thin film transistor ST may play a role of selecting a pixel P which would be driven.

The driving thin film transistor DT may play a role of driving the light emitting diode OLE of the selected pixel P by the switching thin film transistor ST. The driving thin film transistor DT may include a gate electrode DG, a semiconductor layer DA, a source electrode DS and a drain electrode DD. The gate electrode DG of the driving thin film transistor DT may be connected to the drain electrode SD of the switching thin film transistor ST. For example, the gate electrode DG of the driving thin film transistor DT may be extended form the drain electrode SD of the switching thin film transistor ST. In the driving thin film transistor DT, the drain electrode DD may be branched from or connected to the driving current line VDD, further, the source electrode DS may be connected to the anode electrode (or pixel electrode) ANO of the light emitting diode (or light emitting element) OLE. The semiconductor layer DA may be disposed as crossing over the gate electrode DG. In the semiconductor layer DA, the overlapped portion with the gate electrode DG may be defined as a channel area. The source electrode DS may be connected at one side of the semiconductor layer DA around the channel area, and the drain electrode DD is connected to the other side of the semiconductor layer DA. A storage capacitance (or, capacitor) Cst may be disposed between the gate electrode DG of the driving thin film transistor DT and the anode electrode ANO of the light emitting diode OLE.

The light emitting diode OLE may generate light according to the current controlled by the driving thin film transistor DT. The driving thin film transistor DT may control the amount of current flowing from the driving current line VDD to the light emitting diode OLE according to the voltage difference between the gate electrode DG and the source electrode DS.

The light emitting diode OLE may include an anode electrode ANO, an emission layer EL, and a cathode electrode CAT. The light emitting diode OLE may emit lights according to the current controlled by the driving thin film transistor DT. In other words, the light emitting diode OLE may provide an image by emitting light according to the current controlled by the driving thin film transistor DT. The anode electrode ANO of the light emitting diode OLE may be connected to the source electrode DS of the driving thin film transistor DT. The cathode electrode (or, common electrode) CAT may be low voltage line VSS supplied with the low voltage. Therefore, the light emitting diode OLE may be driven by the electric current flown from the driving current line VDD to the low voltage line VSS controlled by the driving thin film transistor DT.

The compensation thin film transistor VT and the compensation light emitting diode DLE may be disposed as overlapping with the black matrix BM. The compensation thin film transistor VT may be connected to a compensation scan line SLL and a compensation current line VLL. For example, the compensation thin film transistor VT may include a gate electrode VG, a source electrode VS and a drain electrode VD. The gate electrode VG may be connected to or branched from the compensation scan line SLL. The source electrode VS may be connected to the compensation current line VLL. The drain electrode VD may be connected to the anode electrode DAN of the compensation light emitting diode DLE. The cathode electrode CAT of the compensation light emitting diode DLE may be extended from the cathode electrode CAT of the light emitting diode OLE. The cathode electrode CAT may be connected to the low voltage line VSS.

Referring to a cross-sectional structure, a light emitting display device may include a substrate 110, a driving element layer 220, a light emitting element layer 330, an encapsulation layer 440 and a color filter layer 550. The driving element layer 220 may include a plurality of thin layers formed on the substrate 110. The driving element layer 220 may include a switching thin film transistor ST and a driving thin film transistor DT.

On the substrate 110, a data line DL, a driving current line VDD, a compensation current line VLL and a light shielding layer LS may be formed. The light shielding layer LS may be disposed in an island shape spaced apart from the data line DL, the driving current line VDD and the compensation current line VLL by a predetermined distance and overlapping the semiconductor layers SA, DA and VA. In some cases, the light shielding layer LS may be omitted.

A buffer layer BUF is deposited on entire surface of the substrate 110 as covering the driving current line VDD, the data line DL, the compensation current line VLL and the light shielding layer LS. On the buffer layer BUF, the semiconductor layer SA of the switching thin film transistor ST, the semiconductor layer DA of the driving thin film transistor DT and the semiconductor layer VA of the compensation thin film transistor VT are formed. The switching thin film transistor ST and the driving thin film transistor DT are formed on the buffer layer BUF. It is preferable that the channel areas in the semiconductor layers SA, DA and VA overlap with the light shielding layer LS.

A gate insulating layer GI is deposited on the substrate 110 as covering the semiconductor layers SA, DA and VA. A gate electrode SG overlapping with the semiconductor layer SA of the switching thin film transistor ST, the gate electrode DG overlapping with the semiconductor layer DA of the driving thin film transistor DT and the gate electrode VG overlapping with the semiconductor layer VA of the compensation thin film transistor VT are formed on the gate insulating layer GI. In addition, at both sides of the gate electrode SG of the switching thin film transistor ST, a source electrode SS contacting one side of the semiconductor layer SA while being spaced apart from the gate electrode SG, and a drain electrode SD contacting the other side of the semiconductor layer SA are formed. Further, at both sides of the gate electrode DG of the driving thin film transistor DT, a source electrode DS contacting one side of the semiconductor layer DA while being spaced apart from the gate electrode DG, and a drain electrode DD contacting the other side of the semiconductor layer DA are formed. In addition, at both sides of the gate electrode VG of the driving thin film transistor VT, a source electrode VS contacting one side of the semiconductor layer VA while being spaced apart from the gate electrode VG, and a drain electrode VD contacting the other side of the semiconductor layer VA are formed.

The gate electrodes SG, DG and VG and the source-drain electrodes SS-SD, DS-DD and VS-VD are formed on the same layer, but are spatially and electrically separated from each other. The source electrode SS of the switching thin film transistor ST may be connected to the data line DL via a contact hole penetrating the gate insulating layer GI. Further, the drain electrode DD of the driving thin film transistor DT may be connected to the driving current line VDD via another contact hole penetrating the gate insulating layer. In addition, the source electrode VS of the compensation thin film transistor VT may be connected to the compensation current line VLL via a contact hole penetrating the gate insulating layer GI.

A passivation layer PAS is deposited on the substrate 110 as covering the thin film transistors ST, DT and VT. The passivation layer PAS may be made of an inorganic material such as silicon oxide ($SiO_x$) or silicon nitride ($SiN_x$). A portion from the upper surface of the substrate 110 to the passivation layer PAS may be called the driving element layer 220.

The light emitting element layer 330 is formed on the driving element layer 220. The light emitting element layer 330 may include a planarization layer PL and a light emitting diode OLE. The planarization layer PL may be a layer used to flatten the uneven surface of the substrate 110 on which the thin film transistors ST, DT and VT are formed. In order to equalize or compensate the height difference due to the uneven surface condition, the planarization layer PL may be formed of an organic material. A pixel contact hole PH may be formed at the passivation layer PAS and the planarization layer PL to expose a portion of the source electrode DS of the driving thin film transistor DT. In addition, a contact hole exposing some portions of the drain electrode VD of the compensation thin film transistor VT may be formed at the passivation layer PAS.

An anode electrode (or, pixel electrode) ANO and a compensation anode electrode DAN may be formed on the top surface of the planarization layer PL. The anode electrode ANO may be connected to the source electrode DS of the driving thin film transistor DT via a pixel contact hole PH. The compensation anode electrode DAN may be connected to the drain electrode VD of the compensation thin film transistor VT via a contact hole. The anode electrode ANO may have different structure and configuring elements according to the emission type of the light emitting diode OLE. For example, in the case of a bottom emission type that provides lights in the direction of the substrate 110, it may be formed of a transparent conductive material. For another example, in the case of a top emission type that provides lights in the upward direction facing the substrate 110, it may be formed of a metal material having excellent light reflectance. Otherwise, for the case of top emission type emitting light to the upper direction opposite the substrate 110, a reflective layer formed of a metal material with excellent light reflectance may be further included below or above the transparent layer formed of a transparent conductive material. For example, the anode electrode ANO may include any one metal material such as silver (Ag), aluminum (Al), magnesium (Mg), calcium (Ca), gold (Au), copper (Cu), molybdenum (Mo) and titanium (Ti) or alloy metal material thereof. The compensation anode electrode DAN may be made of the same material as the anode electrode ANO.

A bank BA is formed on the top surface of the substrate 110 having the anode electrode ANO and the compensation anode electrode DAN. The bank BA is preferably an insulating layer made of an inorganic material or an organic material. Hereinafter, a case made of an inorganic material will be described. The bank BA covers the circumferential areas of the anode electrode ANO and the compensation anode electrode DAN, and exposes most of the middle area. The middle area exposed from the bank BA is defined as an emission area EA, and the area covered by bank BA is defined as a non-emission area NEA.

The compensation anode electrode DAN may be disposed within the area covered by the black matrix BM. Even though the compensation anode electrode DAN may have an exposed middle area from the bank BA, the compensation anode electrode DAN may be disposed under the black matrix BM.

An emission layer EL is disposed on the anode electrode ANO, the compensation anode electrode DAN and bank BA. The emission layer EL may be deposited on entire of the display area AA of the substrate 110 as one layer covering the anode electrode ANO, the compensation anode electrode DAN and the bank BA. The emission layer EL may be deposited over the emission area EA and the non-emission area NEA. For an example, the emission layer EL may include at least two emission parts for generating white light. In detail, the emission layer EL may include a first emission part and a second emission part vertically stacked for generating white light by mixing the first light from the first emission part and the second light from the second emission part.

For another example, the emission layer EL may include any one of a blue emission part, a green emission part, and a red emission part for generating light corresponding to a color set in each pixel. Further, the light emitting diode OLE may include a functional layer for improving light emitting efficiency and/or lifetime of the emission layer EL.

A cathode electrode (or common electrode) CAT is deposited on the entire surface of the substrate 110 on which the emission layer EL is formed. The cathode electrode CAT is deposited to make surface contact with the emission layer EL. The cathode electrode CAT is formed over the entire substrate 110 to be commonly connected to the emission layer EL deposited in all pixels. The cathode electrode CAT may be deposited as covering the emission area EA and the non-emission area NEA like the emission layer EL. In the case of the bottom emission type, the cathode electrode CAT may include a metal material having excellent reflectance with a thickness of 2,000 Å or more.

For the top emission type, the cathode electrode CAT may include transparent conductive material. For example, the cathode electrode CAT may be made of a transparent conductive material such as indium-tin-oxide (ITO) or indium-zinc-oxide (IZO). Alternatively, the cathode electrode CAT may include a thin metal such as aluminum (Al), magnesium (Mg), calcium (Ca), silver (Ag) or an alloy or combination thereof (e.g., aluminum-magnesium alloy (AlMg)). It may be formed to have light-transmitting characteristics by forming it with a thin thickness in a range of 20 Å to 300 Å. The present disclosure may be related to the top emission type light emitting display device.

An encapsulation layer 440 is stacked on the light emitting element layer 330. The encapsulation layer 440 may have a single-layer structure made of an inorganic material, or a multi-layer structure in which several inorganic layers are sequentially stacked. As another example, the encapsulation layer 440 may have a structure in which an inorganic layer, an organic layer and an inorganic layer are continuously stacked. Here, for convenience of description, the encapsulation layer 440 made of a single inorganic layer will be used for explanation. The encapsulation layer 440 may be called a capping layer. In some cases, the encapsulation layer 440 may have a structure in which a capping layer and an organic encapsulation layer may be stacked.

A color filter layer 550 is stacked on the encapsulation layer 440. The color filter layer 550 may include a color filter CF and a black matrix BM. In the color filter layer 550, a plurality of color filters CF may be arranged in a matrix manner to correspond to the arrangement of the pixels P. The color filter CF may be disposed with a structure in which one of a red color filter, a green color filter and a blue color filter is assigned to each emission area EA. As another example, the color filter CF may be disposed with a structure in which one of a red color filter, a white color filter, a green color filter and a blue color filter is allocated to each emission area EA. Hereinafter, for convenience of description, a case, in which the color filter CF includes a red color filter R, a green color filter G and a blue color filter B, representing the triple primary color light, is used for explanation.

The black matrix BM may be disposed as corresponding to the non-emission area NEA. Even though an element generating lights may be disposed under the black matrix BM, the light may be blocked by the black matrix BM.

For the case of the top emission type, lights emitted from the emission layer EL of the light emitting diode OLE including the anode electrode ANO, the emission layer EL and the cathode electrode CAT sequentially stacked each other, may be provided to the outside of the display device through the cathode electrode CAT. In this case, it is required to form the anode electrode ANO with a thickness of 2,000 Å to 3,000 Å using a metal material with excellent light reflectance. Further, the cathode electrode CAT may preferably be made of a transparent conductive material or, a semi-transparent conductive material.

With the above-mentioned structure, as the resolution increases, the spacing between pixels P becomes narrower. In such a case, holes may leak along the lateral direction from the hole functional layer constituting the light emitting layer EL of on light emitting diode OLE of a pixel P to the light emitting diode OLE of the neighboring pixel P. This current may be called 'lateral leakage current'. When the lateral leakage current occurs, it may cause a higher current than the anode current required to drive the light emitting diode OLE, resulting in a higher grayscale than the implemented grayscale. Accordingly, image quality may be distorted.

Among the methods for preventing the lateral leakage current, a method of forming a trench by removing a portion of the planarization layer PL around a pixel P or between pixels P has been proposed. By forming a trench surrounding the pixel P, the connection between the pixels P of the emission layer EL may be cut off by the trench, so that the leakage current may not flow. Further, even though the emission layer EL may be disconnected by the trench, the lateral length of the emission layer EL may be increased by the trench, so that the leakage current may not be transmitted to the neighboring pixel.

The method of forming a trench may have an advantage of blocking the lateral leakage current, thereby preventing image quality distortion caused by the lateral leakage current. However, when a pixel changes from a low-gray level to a high-gray level, it may not be able to display correct grayscale value, especially when the difference in changed grayscale value is very large. To solve this problem, a compensating circuit may be used to implement the grayscale compensation. For this purpose, it may be configured to maintain the lateral leakage current to some level, not completely eliminate the lateral leakage current. However, when the lateral leakage current is not accurately controlled, the grayscale compensation is not properly implemented.

By providing a compensation light emitting diode, the light emitting display device according to the present disclosure may have advantages of not only blocking the lateral leakage current, but also enhancing the reliability of driving the light emitting diode. The following description explains the functional characteristics and structural feature of the compensation light emitting diode. The compensation light emitting diode may have a structural feature for supplying a compensation current to the light emitting diode of the corresponding pixel or for removing a lateral leakage current generated in the light emitting diode of the corresponding pixel.

The light emitting diodes OLE disposed at the first pixel P1 and the second pixel P2, and the compensation light emitting diode DLE disposed between the first pixel P1 and the second pixel P2 may have the same structure. For example, the anode electrodes ANO of the light emitting diodes OLE and the compensation anode electrodes DAN of the compensation light emitting diodes DLE are separated from each other. On the contrary, the emission layer EL may be continuously deposited from the first pixel P1 to the second pixel P2 through the compensation light emitting diode DLE. Along the emission layer EL, the lateral leakage current may flow when the first pixel P1 or the second pixel P2 is operated.

When a condition is satisfied that the lateral leakage current may adversely affect the neighboring pixel, the lateral leakage current may be controlled to be discharged to the outside through a compensation light emitting diode DLE. For example, when either the first pixel P1 or the second pixel P2 displays high brightness, a high amount of current provided from the anode electrode of the pixel may be transferred to the neighboring pixel along the emission layer EL. Then, in the neighboring pixel, as more current may be applied to the light emitting diode OLE than the current provided by the driving thin film transistor DT, the distortion of the brightness may occur. In this case, a voltage lower than the voltage applied to the cathode electrode CAT (e.g., a negative voltage) may be applied to the compensation current line VLL connected to the source electrode VS of the compensation thin film transistor VT. Then, the lateral leakage current may be discharged outside through the compensation anode electrode DAN of the compensation light emitting diode DLE and the compensation current line VLL disposed between the first pixel P1 and the second pixel P2.

Sometimes there may be a situation where the lateral leakage current may be required to be transferred from the first pixel P1 to the second pixel P2 for driving the light emitting diode of the second pixel P2, or from the second pixel P2 to the first pixel P1 for driving the light emitting diode OLE of the first pixel P1. In this case, the lateral leakage current may be controlled to flow through the emission layer EL of the compensation light emitting diode DLE. For example, by applying the same voltage to the compensation current line VLL as the low voltage line VSS, the lateral leakage current may be induced to flow to neighboring pixels through the emission layer EL.

In some cases, when a situation is needed where a compensation current greater than the lateral leakage current is required for the first pixel P1 or the second pixel P2, the compensation current may be additionally supplied to the first pixel P1 or the second pixel P2 through the compensation light emitting diode DLE. For example, when displaying a perfect black at a pixel and then changing to display a gray scale, or displaying a low (or dark) gray scale and then changing to display a high (or bright) gray scale with high brightness, it may be difficult to drive the pixel to emit the specified high brightness within a short period of time. In this case, correct image having the intended gray scale value may be provided by supplying compensation current using a compensation light emitting diode DLE. By applying a voltage/current required for compensation to a compensation current line VLL connected to a source electrode VS of a compensation thin film transistor VT, a compensation current may be supplied to the first pixel P1 through the emission layer EL.

By arranging a compensation thin film transistor VT and a compensation light emitting diode DLE in a part of a black matrix BM surrounding a pixel P, the driving current of the pixel P may be controlled. Therefore, a high quality image information may be provided without distortion of luminance.

Second Embodiment

Figure 5:
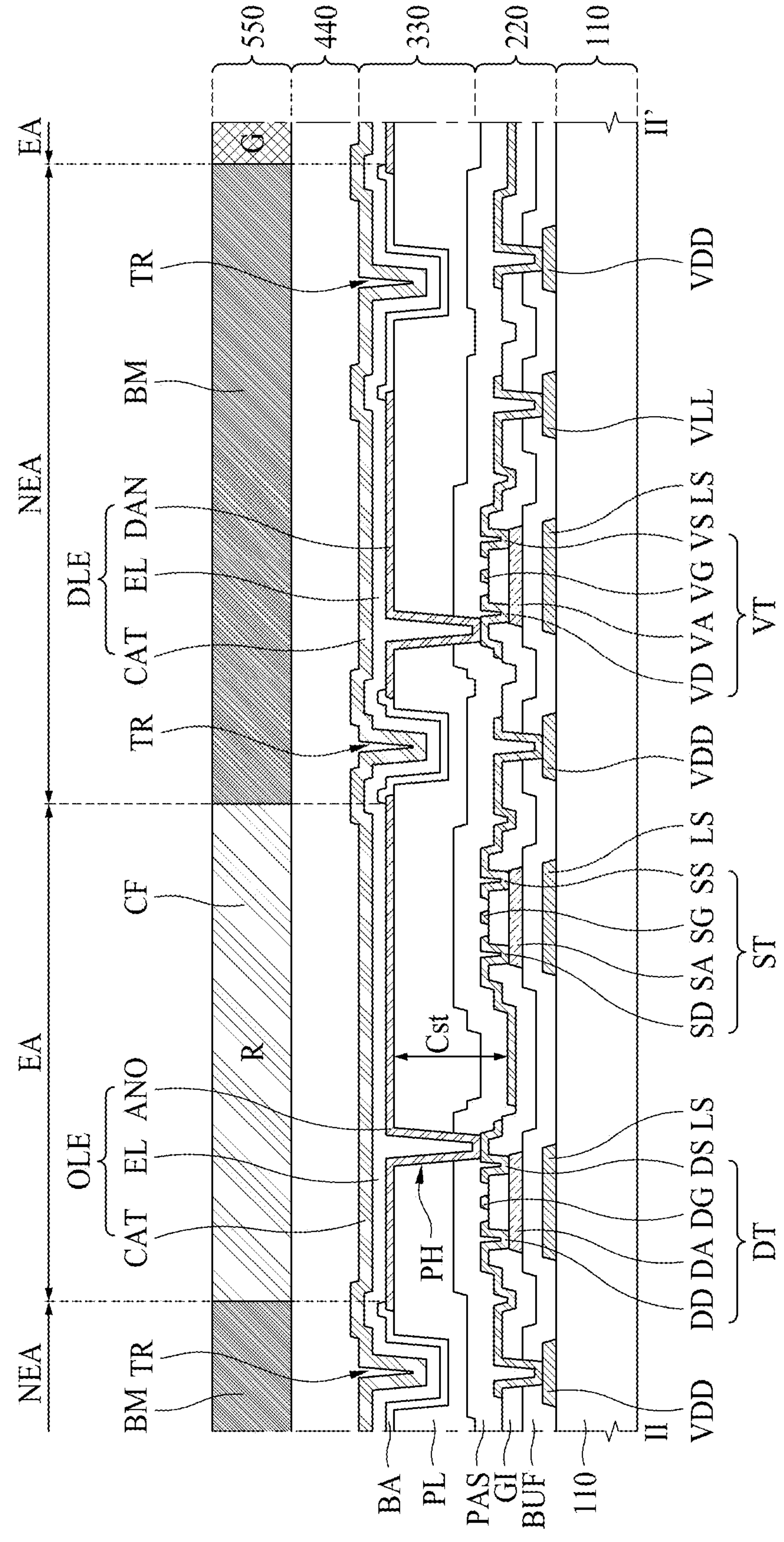
FIG. 5 is a cross-sectional view, cutting along line II-II', for illustrating a structure of one pixel in a light emitting display device according to one or more embodiments of the present disclosure.

Hereinafter, referring to FIG. 5, a structure of a light emitting display device according to one or more embodiments of the present disclosure will be explained. FIG. 5 is a cross-sectional view, cutting along line II-II', for illustrating a structure of one pixel in a light emitting display device according to one or more embodiments of the present disclosure.

The basic configuration and structure of the light emitting display device according to FIG. 5 may be the same as those of the light emitting display device according to FIGS. 3-4. The difference is that the light emitting display device of FIG. 5 has a feature of a trench TR around the light emitting diode OLE in the non-emission area NEA. In the following description, elements not explained but depicted with drawing symbols in FIG. 5 may be referred to the description of the light emitting display device according to FIGS. 3-4.

The trench TR may be formed by patterning the bank BA and/or the planarization layer PL. For example, as shown in FIG. 5, by depressing or suppressing some portions of the planarization layer PL, a trench TR may be formed to have a predetermined depth. After forming the trench TR, the emission layer EL and the cathode electrode CAT may be sequentially deposited. With this condition, even though the lateral leakage current occurs in the lateral direction along the emission layer EL, the path through which the lateral leakage current flows becomes longer than compared to the case without the trench. As a result, a small amount of the lateral leakage current may be not transmitted to neighboring pixels, and only a relatively high amount of the lateral leakage current may be transmitted between the pixels.

The lateral leakage current may be so low that it may not flow over the trench TR. However, the compensation current may be so high that it may flow over the trench TR. With a trench, the lateral leakage current generated from the light emitting diode OLE of one pixel may not be transmitted to the neighboring pixels. On the contrary, the compensation current provided from the compensation light emitting diode DLE may be delivered to the light emitting diode OLE along the emission layer over the trench TR. The light emitting display device according to FIG. 5 may have a structure configured to prevent the lateral leakage current generated in a light emitting diode OLE and to supply the compensation current provided from the compensation light emitting diode DLE to the light emitting diode OLE.

In the following embodiments, based on the light emitting display device according to FIGS. 3-4, various examples in which a compensation thin film transistor VT and a compensation light emitting diode DLE are arranged in various ways are described. In the following embodiments, the cross-sectional structure may be substantially the same as that of the light emitting display device according to FIG. 4, so the explanation may be described by referring the plan view showing the structural differences.

Third Embodiment

Figure 6:
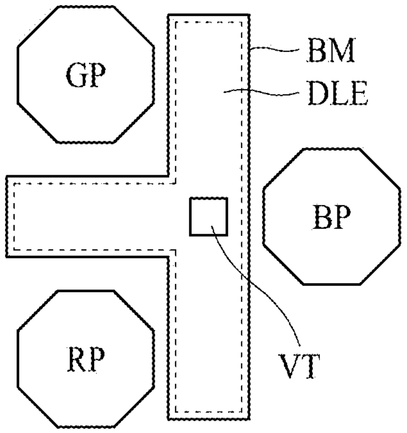
FIG. 6 is a plan view illustrating a structure of a light emitting display device according to one or more embodiments of the present disclosure.

Hereinafter, referring to FIG. 6, a structure of a light emitting display device according to one or more embodiments of the present disclosure will be explained. FIG. 6 is a plan view illustrating a structure of a light emitting display device according to one or more embodiments of the present disclosure.

Referring to FIG. 6, a light emitting display device according to one or more embodiments may have a structure in which a red pixel RP, a green pixel GP and a blue pixel BP may be arranged in a triangular shape. However, it is not limited thereto, and the arrangement structure of pixels may be varied. Further, the shape of each pixel may be not a square shape but a regular octagon shape. The shape of the pixel is not limited thereto, the shape of the pixel P may have various shapes such as triangles, parallelograms, rhombuses, circles or squares.

The light emitting display device according to FIG. 6 includes the black matrix BM that may be disposed between the red pixel RP and the green pixel GP, between the red pixel RP and the blue pixel BP, and between the green pixel GP and the blue pixel BP. Under the black matrix BM, a compensation thin film transistor VT and a compensation light emitting diode DLE may be disposed.

The compensation light emitting diode DLE may be disposed along to the area covered by the black matrix BM. However, it is not limited thereto, and the compensation light emitting diode DLE may be disposed as occupying some area between the red pixel RP and the green pixel GP, between the red pixel RP and the blue pixel BP, and between the green pixel GP and the blue pixel BP. The compensation thin film transistor VT may be disposed at one position under the black matrix BM.

For another example, even though it is not shown in figures, the compensation thin film transistors VT and the compensation light emitting diodes DLE may be formed separately. For example, a first compensation light emitting diode and a first compensation thin film transistor may be disposed between the red pixel RP and the green pixel GP. A second compensation light emitting diode and a second compensation thin film transistor may be disposed between the red pixel RP and the blue pixel BP. A third compensation light emitting diode and a third compensation thin film transistor may be disposed between the green pixel GP and the blue pixel BP.

Fourth Embodiment

Figure 7:
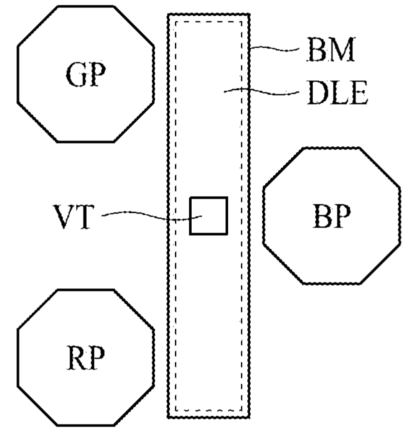
FIG. 7 is a plan view illustrating a structure of a light emitting display device according to one or more embodiments of the present disclosure.

Hereinafter, referring to FIG. 7, a structure of a light emitting display device according to one or more embodiments of the present disclosure will be explained. FIG. 7 is a plan view illustrating a structure of a light emitting display device according to one or more embodiments of the present disclosure.

A light emitting display device according to an embodiment shown in FIG. 7 may have very similar structure to that of the embodiment shown in FIG. 6. The difference is that the compensation light emitting diode is not disposed between the green pixel GP and the red pixel RP. The light emitting display device according to the embodiment shown in FIG. 7 may have a compensation light emitting diode DLE and a compensation thin film transistor VT disposed between the green pixel GP and the blue pixel, and between the red pixel RP and the blue pixel BP. The compensation light emitting diode DLE and the compensation thin film transistor VT may be covered by the black matrix BM.

Even though it is not shown in figures, there is no compensation light emitting diode between the green pixel GP and the red pixel RP, the black matrix BM may be further placed between. the green pixel GP and the red pixel RP The black matrix BM may function to prevent light leakage between two neighboring pixels.

Fifth Embodiment

Figure 8:
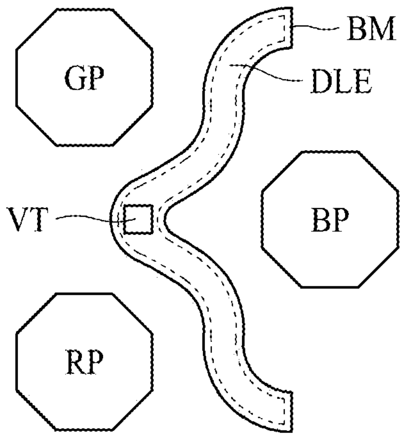
FIG. 8 is a plan view illustrating a structure of a light emitting display device according to one or more embodiments of the present disclosure.

Hereinafter, referring to FIG. 8, a structure of a light emitting display device according to one or more embodiments of the present disclosure will be explained. FIG. 8 is a plan view illustrating a structure of a light emitting display device according to one or more embodiments of the present disclosure.

A light emitting display device according to an embodiment shown in FIG. 8 may include a black matrix BM having a free curve shape. A compensation light emitting diode DLE and a compensation thin film transistor VT may be disposed under the black matrix BM of a free curve shape. The black matrix BM and the compensation light emitting diode DLE having a free curve shape may be disposed as completely separating between the green pixel GP and the blue pixel BP and between the red pixel RP and the blue pixel BP. Further, the free curve shape may partially separate between the green pixel GP and the red pixel RP.

Sixth Embodiment

Figure 9:
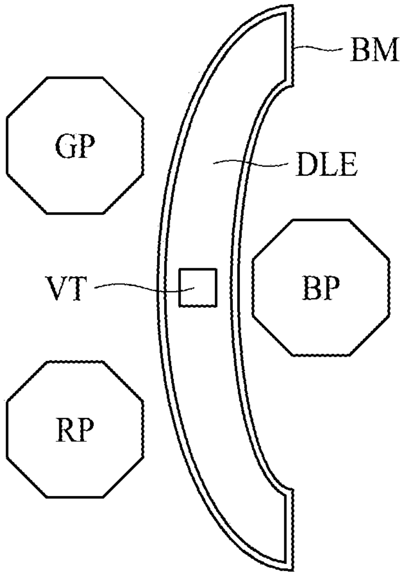
FIG. 9 is a plan view illustrating a structure of a light emitting display device according to one or more embodiments of the present disclosure.

Hereinafter, referring to FIG. 9, a structure of a light emitting display device according to one or more embodiments of the present disclosure will be explained. FIG. 9 is a plan view illustrating a structure of a light emitting display device according to one or more embodiments of the present disclosure.

A light emitting display device according to an embodiment shown in FIG. 9 may have very similar structure to that of the embodiment shown in FIG. 7. The different feature of the embodiment shown in FIG. 9 is that the shape of the black matrix BM and the compensation light emitting diode DLE does not have a straight-line shape but have an arc shape. However, it is not limited thereto, and the shape may be various.

Seventh Embodiment

Figure 10:
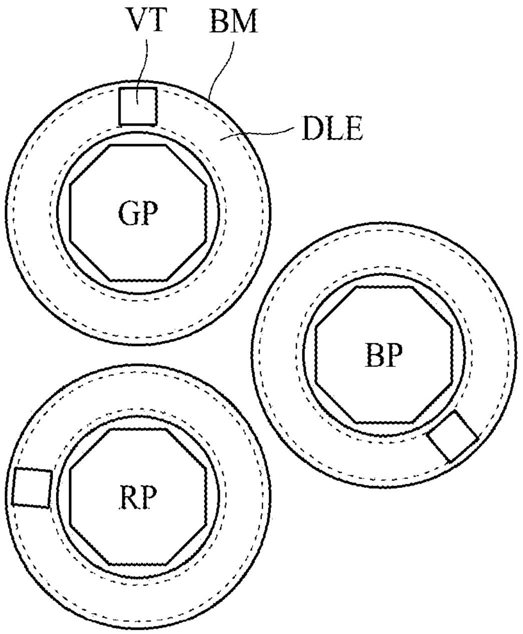
FIG. 10 is a plan view illustrating a structure of a light emitting display device according to one or more embodiments of the present disclosure.

Hereinafter, referring to FIG. 10, a structure of a light emitting display device according to one or more embodiments of the present disclosure will be explained. FIG. 10 is a plan view illustrating a structure of a light emitting display device according to one or more embodiments of the present disclosure.

Referring to FIG. 10, a light emitting display device according to one or more embodiments may have a structure in which a red pixel RP, a green pixel GP and a blue pixel BP may be arranged in a triangular shape. Each pixel may have a regular octagon shape. However, it is not limited thereto, and the arrangement structure of pixels and the shape of each pixel may be varied. The three pixels may have the same shape. However, it is not limited thereto, and three pixels may have different shapes. For example, the green pixel GP and the red pixel RP may have a regular octagon shape, and the blue pixel BP may have a rectangular shape in which the vertical length is longer than the horizontal length.

In the light emitting display device according to the embodiment shown in FIG. 10, each pixel may be surrounded by the black matrix BM having a closed curve with a circular ring shape. Under each of the black matrix BM, a compensation light emitting diode DLE and a compensation thin film transistor VT may be disposed. In particular, the compensation light emitting diode DLE may have a closed curve with a circular shape to surround each pixel. By arranging a compensation light emitting diode DLE and a compensation thin film transistor VT for each pixel, the compensation current may be provided independently for each pixel or the lateral leakage current may be controlled independently.

Eighth Embodiment

Figure 11:
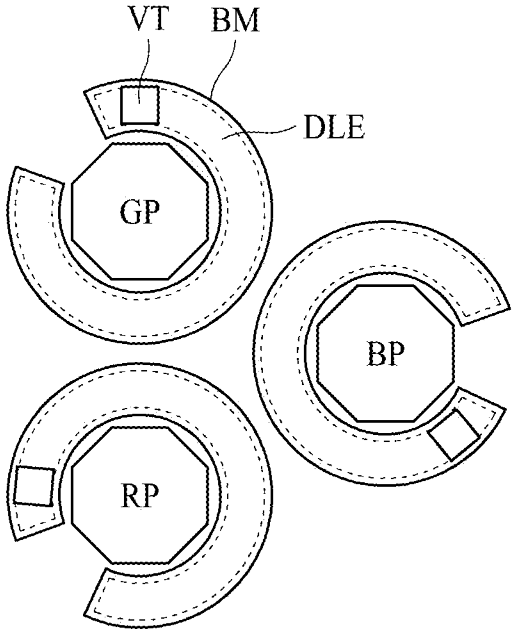
FIG. 11 is a plan view illustrating a structure of a light emitting display device according to one or more embodiments of the present disclosure.

Hereinafter, referring to FIG. 11, a structure of a light emitting display device according to one or more embodiments of the present disclosure will be explained. FIG. 11 is a plan view illustrating a structure of a light emitting display device according to one or more embodiments of the present disclosure.

A light emitting display device according to an embodiment shown in FIG. 11 may have very similar structure to the light emitting display device shown in FIG. 10. The difference feature of the embodiment shown in FIG. 11 is that the compensation light emitting diode DLE surrounding each pixel may have an open ring (or curve) shape rather than a completely closed ring (or curve) shape.

While the compensation light emitting diode DLE may have an open ring shape, the black matrix BM may have a closed ring shape as shown in FIG. 10. In this case, the open portion of the ring shape of the compensation light emitting diode DLE may be arranged in the opposite direction of the neighboring pixels in one unit pixel. On the other hand, even though it is not shown in figures, the open portion of the compensation light emitting diode DLE may be arranged toward neighboring pixels in one unit pixel.

Ninth Embodiment

Figure 12:
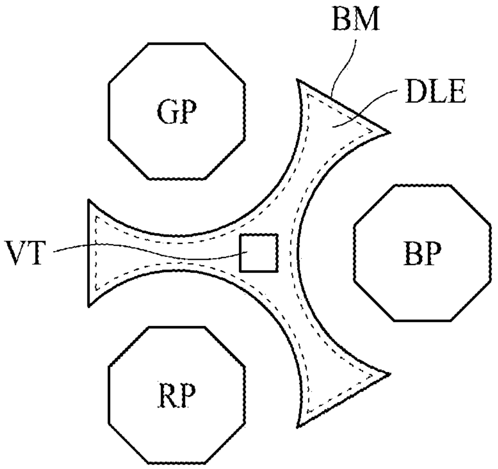
FIG. 12 is a plan view illustrating a structure of a light emitting display device according to one or more embodiments of the present disclosure.

Hereinafter, referring to FIG. 12, a structure of a light emitting display device according to one or more embodiments of the present disclosure will be explained. FIG. 12 is a plan view illustrating a structure of a light emitting display device according to one or more embodiments of the present disclosure.

The light emitting display device according to the embodiment shown in FIG. 12 may have a compensation light emitting diode DLE having a shape corresponding to the area where the red pixel RP, the green pixel GP and the blue pixel BP face each other. The compensation light emitting diode DLE may be covered by the black matrix BM. In this case, a compensation thin film transistor VT may be disposed at center position of the compensation light emitting diode DLE. However, it is not limited thereto, and each of the plurality of compensation thin film transistor VT may be disposed at each end portion of the compensation light emitting diode DLE.

The black matrix BM may have the same shape with the compensation light emitting diode DLE, and may have slightly larger size than the compensation light emitting diode DLE. For another example, the black matrix BM may have a shape completely surrounding each of the pixels.

Tenth Embodiment

Figure 13:
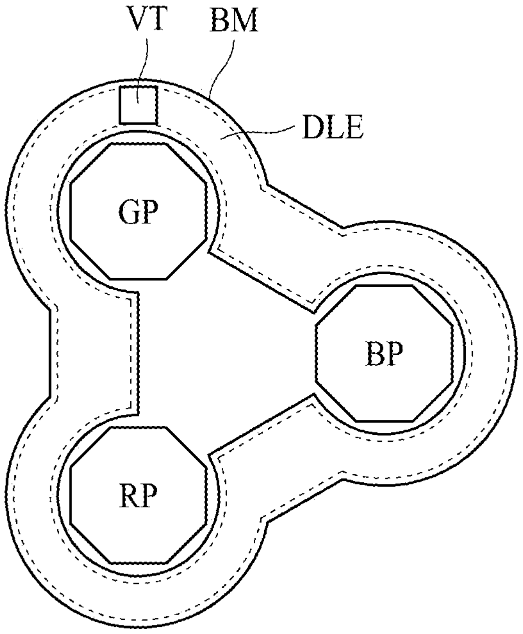
FIG. 13 is a plan view illustrating a structure of a light emitting display device according to one or more embodiments of the present disclosure.

Hereinafter, referring to FIG. 13, a structure of a light emitting display device according to one or more embodiments of the present disclosure will be explained. FIG. 13 is a plan view illustrating a structure of a light emitting display device according to one or more embodiments of the present disclosure.

A light emitting display device according to an embodiment shown in FIG. 13 may include a compensation light emitting diode DLE having a closed curve shape surrounding the perimeter of three pixels. Further, the compensation light emitting diode DLE may disposed at some portions between the green pixel GP and the red pixel RP, at some portions between the green pixel GP and the blue pixel BP, and at some portions between the red pixel RP and the blue pixel BP. The compensation light emitting diode DLE may be fully covered by a black matrix BM. In this case, a compensation thin film transistor DT may be disposed at one position of the area covered by the black matrix BM.

Eleventh Embodiment

Figure 14:
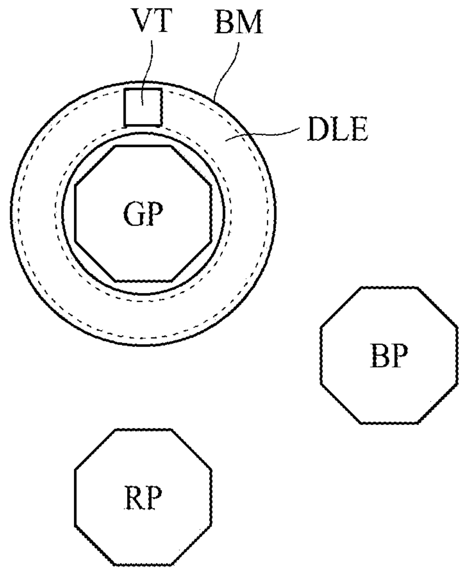
FIG. 14 is a plan view illustrating a structure of a light emitting display device according to one or more embodiments of the present disclosure.

Hereinafter, referring to FIG. 14, a structure of a light emitting display device according to one or more embodiments of the present disclosure will be explained. FIG. 14 is a plan view illustrating a structure of a light emitting display device according to one or more embodiments of the present disclosure.

A light emitting display device according to an embodiment shown in FIG. 14 may include a compensation light emitting diode DLE surrounding any one pixel among three pixels configuring one unit pixel. For example, the compensation light emitting diode DLE may be disposed as surrounding the green pixel GP. Further, a compensation thin film transistor VT may be disposed under the compensation light emitting diode DLE. The compensation light emitting diode DLE may be covered by a black matrix BM.

The red pixel RP and the blue pixel BP may not have the compensation light emitting diode. FIG. 14 shows that the compensation light emitting diode DLE may be disposed as surrounding only the green pixel GP. However, it is not limited thereto, and the compensation light emitting diode DLE may be disposed as surrounding only the red pixel RP. Otherwise, the compensation light emitting diode DLE may be disposed as surrounding only the blue pixel BP.

Twelfth Embodiment

Figure 15:
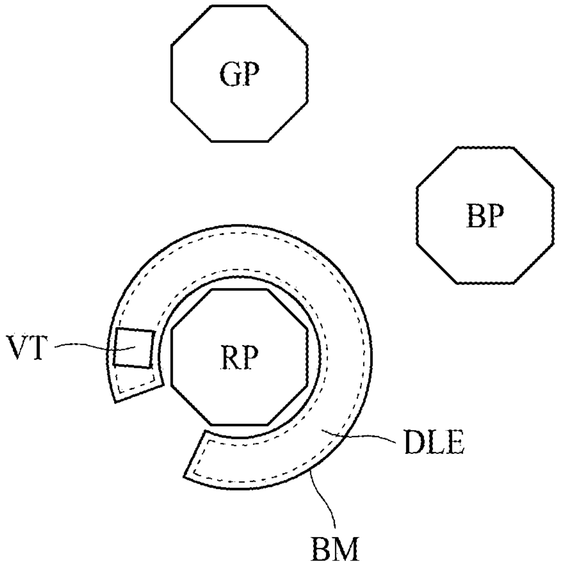
FIG. 15 is a plan view illustrating a structure of a light emitting display device according to one or more embodiments of the present disclosure.

Hereinafter, referring to FIG. 15, a structure of a light emitting display device according to one or more embodiments of the present disclosure will be explained. FIG. 15 is a plan view illustrating a structure of a light emitting display device according to one or more embodiments of the present disclosure.

A light emitting display device according to an embodiment shown in FIG. 15 may include a compensation light emitting diode DLE disposed as surrounding only one pixel among three pixels configuring one unit pixel. In particular, the compensation light emitting diode DLE may have an open curve shape in which an open portion is located at one portion around the pixel. For example, the compensation light emitting diode DLE may be disposed as having an open curve shape surrounding the red pixel RP. Under the compensation light emitting diode DLE, a compensation thin film transistor VT may be disposed. The compensation light emitting diode DLE may be fully covered by a black matrix BM. FIG. 15 shows that the black matrix BM has an open curve shape. However, it is not limited thereto, and the black matrix BM may have a close curve shape fully surrounding the red pixel RP.

The green pixel GP and the blue pixel BP may not have the compensation light emitting diode. FIG. 15 shows that the compensation light emitting diode DLE may be disposed as surrounding only the red pixel RP. However, it is not limited thereto, and the compensation light emitting diode DLE may be disposed as surrounding only the green pixel GP. Otherwise, the compensation light emitting diode DLE may be disposed as surrounding only the blue pixel BP.

The features, structures, effects and so on described in the above embodiments of the present disclosure are included in at least one embodiment of the present disclosure, and are not necessarily limited to only one embodiment. Furthermore, the features, structures, effects and the like explained in at least one embodiment may be implemented in combination or modification with respect to other embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific embodiments disclosed in the present disclosure and the claims, but should be construed to include all possible embodiments along with the full scope of equivalents to which such claims are entitled. Accordingly, the claims are not limited by the disclosure.

What is claimed is:

1. A light emitting display device, comprising:
- a pixel on a substrate, the pixel including an emission area and a non-emission area;
- a light emitting diode disposed at the emission area;
- a compensation light emitting diode disposed at the non-emission area; and
- an emission layer extended from the light emitting diode to the compensation light emitting diode.

2. The light emitting display device according to claim 1, further comprising:
- a color filter disposed at the emission area; and
- a black matrix disposed at the non-emission area.

3. The light emitting display device according to claim 2, wherein the light emitting diode is disposed to correspond to the color filter, and
- wherein the compensation light emitting diode is disposed to correspond to the black matrix.

4. The light emitting display device according to claim 1, further comprising:
- a driving thin film transistor connected to the light emitting diode;
- a switching thin film transistor connected to the driving thin film transistor; and
- a compensation thin film transistor connected to the compensation light emitting diode.

5. The light emitting display device according to claim 4, further comprising:
- a scan line and a data line connected to the switching thin film transistor;
- a driving voltage line connected to the driving thin film transistor; and
- a compensation scan line and a compensation current line connected to the compensation thin film transistor.

6. The light emitting display device according to claim 1, wherein the light emitting diode includes:
- an anode electrode;
- an emission layer on the anode electrode; and
- a cathode electrode on the emission layer, and
- wherein the compensation light emitting diode includes:
  - a compensation anode electrode;
  - the emission layer on the compensation anode electrode; and
  - the cathode electrode on the emission layer.

7. The light emitting display device according to claim 1, wherein the compensation light emitting diode is disposed along at least one side of the light emitting diode.

8. The light emitting display device according to claim 1, wherein the compensation light emitting diode has a close curve shape fully surrounding the light emitting diode.

9. The light emitting display device according to claim 1, wherein the compensation light emitting diode has an open curve shape partially surrounding the light emitting diode.

10. The light emitting display device according to claim 1, wherein the light emitting diode includes a first light emitting diode and a second light emitting diode arranged on the substrate, and
- wherein the compensation light emitting diode is disposed between the first light emitting diode and the second light emitting diode.

11. The light emitting display device according to claim 10, wherein the compensation light emitting diode has a close curve shape fully surrounding the first light emitting diode.

12. The light emitting display device according to claim 10, wherein the compensation light emitting diode has an open curve shape partially surrounding the first light emitting diode.

13. The light emitting display device according to claim 10, further comprising:
- a third light emitting diode disposed adjacent to the first light emitting diode and the second light emitting diode on the substrate, and
- wherein the compensation light emitting diode is disposed at least one of between the first light emitting diode and the second light emitting diode, between the second light emitting diode and the third light emitting diode, and between the first light emitting diode and the third light emitting diode.

14. The light emitting display device according to claim 13, wherein the compensation light emitting diode has a close curve shape surrounding the first light emitting diode, the second light emitting diode and the third light emitting diode.

15. The light emitting display device according to claim 13, wherein the compensation light emitting diode has a shape separating the first light emitting diode, the second light emitting diode and the third light emitting diode from each other.

16. A light emitting display device, comprising:
- a pixel on a substrate, the pixel including an emission area and a non-emission area;
- a first anode disposed in the emission area;
- a second anode disposed in the non-emission area;
- a driving thin film transistor connected to the first anode;
- a compensation thin film transistor connected to the second anode;
- a black matrix disposed in the non-emission area, the black matrix overlapping with the second anode; and
- an emission layer disposed on the first anode and the second anode,
- wherein the emission layer extends from a light emitting diode that includes the first anode and the driving thin film transistor to a compensation light emitting diode that includes the second anode and the compensation thin film transistor.

17. The light emitting display device according to claim 16, further comprising a compensation current line connected to a source electrode of the compensation thin film transistor.

18. The light emitting display device according to claim 17, wherein a drain electrode of the compensation thin film transistor is connected to the second anode.

* * * * *